United States Patent
Ueda

[19]

[11] Patent Number: 5,877,617
[45] Date of Patent: Mar. 2, 1999

[54] LOAD CURRENT SUPPLY CIRCUIT HAVING CURRENT SENSING FUNCTION

[75] Inventor: Nobumasa Ueda, Nukata-gun, Japan

[73] Assignee: Denso Corporation, Kariya, Japan

[21] Appl. No.: 884,550

[22] Filed: Jun. 27, 1997

[30] Foreign Application Priority Data

Jun. 28, 1996 [JP] Japan ..................................... 8-170163

[51] Int. Cl.⁶ ....................................................... G05F 3/20
[52] U.S. Cl. ........................................... 323/316; 323/315
[58] Field of Search ..................................... 323/312, 313,
323/315, 316; 327/538, 539; 330/257, 288

[56] References Cited

U.S. PATENT DOCUMENTS

| | | | |
|---|---|---|---|
| 4,319,181 | 3/1982 | Wrathall | 323/315 |
| 4,553,084 | 11/1985 | Wrathall . | |
| 4,885,477 | 12/1989 | Bird et al. | 323/316 |
| 5,008,586 | 4/1991 | Miyazaki et al. | 323/315 |
| 5,061,863 | 10/1991 | Mori et al. . | |
| 5,063,307 | 11/1991 | Zommer | 307/310 |
| 5,081,379 | 1/1992 | Korteling . | |
| 5,084,668 | 1/1992 | Kotowski et al. | 323/315 |
| 5,281,872 | 1/1994 | Mori . | |

FOREIGN PATENT DOCUMENTS 425 035 A2  5/1991  European Pat. Off. .

*Primary Examiner*—Matthew Nguyen
*Attorney, Agent, or Firm*—Pillsbury Madison & Sutro LLP

[57] ABSTRACT

A load current supply circuit having a current sensing function is composed of a current mirror circuit which includes a power transistor circuit and a sense transistor circuit both connected in parallel with each other, and a current detection circuit connected to the sense transistor circuit. Load current is drawn through the power transistor while sensing current which is proportional to the load current and is much less than the load current flows through the sense transistor. The current detection circuit detects the load current based on the sensing current. A current mirror ratio has to be constant under a wide range of ambient temperature in order to secure a current sensing accuracy. To maintain the current mirror ratio at a substantially constant level, a resistance ratio of wiring resistance to transistor ON-resistance in the sense transistor circuit is made substantially equal to that in the power transistor circuit. For this purpose, compensating resistors may be disposed at both sides of the sense transistor in the sense transistor circuit.

12 Claims, 3 Drawing Sheets

FIG. I

LOAD CURRENT SUPPLY CIRCUIT HAVING CURRENT SENSING FUNCTION

CROSS-REFERENCE TO RELATED APPLICATION

This application is based upon and claims benefit of priority of Japanese Patent Application No. Hei-8-170163 filed on Jun. 28, 1996, the content of which is incorporated herein by reference.

BACKGROUND OF THE INVENTION

1. Field of the Invention

The present invention relates to a load current supply circuit having a current sensing function, in which the load current is supplied by a power transistor and the load current is sensed by a sensing circuit, and more particularly to a circuit constituting a current mirror circuit which includes a current sensing function.

2. Description of Related Art

A load current supply circuit having a current sensing function is disclosed, for example, in U.S. Pat. No. 4,553,084. In the circuit disclosed in this U.S. patent, a current mirror circuit is formed by connecting a power MOS transistor and a sense MOS transistor in parallel, and the current flowing through the power transistor is sensed by current flowing through the sense transistor. Respective current flowing through the power transistor and the sense transistor is proportional to the number of transistor cells included in the power transistor and the sense transistor, respectively. For example, assuming the number of cells in the power transistor is 10,000 and that in the sense transistor is 10, the current flowing through the power transistor is 1000 times the current flowing through the sense transistor, i.e., a current mirror ratio is 1000.

In such a current mirror circuit, an ON-resistance of the power transistor is much lower than that of the sense transistor. Therefore, a ratio of a wiring resistance to the ON-resistance in the power transistor circuit is much different from that in the sense transistor circuit. As exemplified in FIG. 4, assuming the ON-resistance of the power transistor is 110 mΩ, the wiring resistance of the power transistor is 40 MΩ, the ON-resistance of the sense transistor is 110 Ω, and the wiring resistance of the sense transistor is 40 mΩ, the wiring resistance ratio in the power transistor circuit is 1000 times higher than that in the sense transistor circuit.

Usually, a metal such as aluminum is used as a wiring material. The temperature coefficient of aluminum is about 3000 ppm/T and that of a MOS transistor is about 4500 ppm/T. Therefore, the current mirror ratio, which is 1000 in the case exemplified above, fluctuates according to temperature. An example of the fluctuation percentages is shown in FIG. 5. If the current mirror ratio varies according to temperature, current detection accuracy decreases.

SUMMARY OF THE INVENTION

The present invention has been made in view of the above-mentioned problem, and an object of the present invention is to provide a load current supply circuit having a current sensing function, the current sensing accuracy of which is not affected by temperature. A load current supply circuit according to the present invention is substantially composed of a power transistor circuit which draws load current therethrough, a sense transistor circuit through which a part of the load current that is proportional to the load current flows, and a current detection circuit connected to the sense transistor circuit for detecting the amount of the load current. The power transistor circuit and the sense transistor circuit are connected in parallel and both circuits form a current mirror circuit.

A current mirror ratio, that is, a ratio of the load current to the sensing current flowing through the sense transistor circuit is set at a high level such as 1000, so that power consumed by sensing the load current is minimal. Since the load current is sensed based on the sensing current, the current mirror ratio has to be constant irrespective of ambient temperature in order to obtain an accurate sensing. The wiring resistance and ON-resistance of the transistors vary according to ambient temperature at different rates, resulting in change of the current mirror ratio. According to the present invention, a resistance ratio of the wiring resistance to the transistor ON-resistance in the sense transistor circuit is made substantially equal to that in the power transistor circuit. Thus, the current mirror ratio is maintained at a substantially constant level under variable ambient temperatures, and therefore the current sensing accuracy is ensured.

To attain the same resistance ratios in both power and sense transistor circuits, compensating resistors may be inserted in the wiring of the sense transistor circuit. The compensating resistors may be made of the same metal material as the wiring of the sense transistor circuit. In this case, values of the resistors can be easily adjusted to mitigate against deviations in manufacturing processes. Also, one compensating resistor may be inserted at one side of the sense transistor and the other compensating resistor at the other side. Preferably, both resistors are made with the same resistance value so that both power and sense transistors operate at a same operating point.

The current mirror ratio may be maintained at a substantially constant level by enabling the current detection circuit to compensate for temperature dependent characteristics of the current mirror circuit.

Other objects and features of the present invention will become more readily apparent from a better understanding of the preferred embodiment described below with reference to the following drawings.

DETAILED DESCRIPTION OF THE PREFERRED EMBODIMENT

Figure 1:
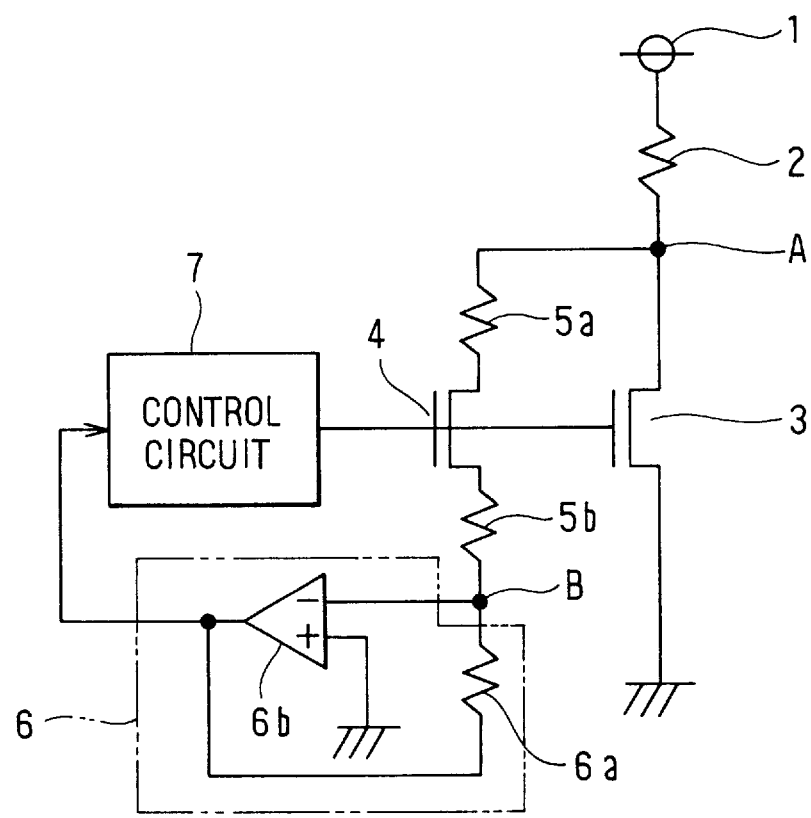
FIG. 1 is a circuit diagram showing an embodiment according to the present invention.

Referring to FIG. 1, an embodiment according to the present invention will be described. A load 2 and an N-channel power transistor 3 are connected in series between a power source 1 and a ground. The power transistor 3 supplies load current to the load 2, and receives gate voltages from a control circuit 7. An N-channel sense transistor 4 is connected in parallel to the power transistor 3. The power transistor 3 and the sense transistor 4 constitute a current mirror circuit with both gates commonly connected. A part of load current which is determined according to a current mirror ratio is, for example, one thousandth of the load current which flows through the sense transistor 4.

The current flowing through the sense transistor 4 is detected by a current detection circuit 6. The current detection circuit 6 is composed of a sense resistor 6a and a comparator 6b. Since a noninverting input terminal of the comparator 6b is grounded, the comparator 6a functions by making a point "B" a virtual ground. In other words, the voltage level of the point "B" is always kept at a ground level by changing an output from the comparator 6b when the voltage level at the point "B" is changed due to the amount of current flowing through the sense transistor 4. When the load current exceeds a predetermined level, the current flowing through the sense transistor 4 increases, and accordingly the voltage level at the point "B" increases, the output of the comparator 6b decreases thereby bringing the voltage level at the point "B" to the ground level. An operating point of the sense transistor 4 is substantially equal to an operating point of the power transistor 3 between the points "A" and "B", because a drain of the sense transistor 4 is connected to a drain of the power transistor 3 at the point "A" and an electrical potential at a source (the point "B") of the sense transistor 4 is controlled at the same level (ground level) as an electrical potential at a source of the power transistor 3.

The control circuit 7 controls the gate voltage of the power transistor 3 and the sense transistor 4. The control circuit 7 limits the load current by decreasing the gate voltage when it detects that the load current exceeds a predetermined level based on the output from the current detection circuit 6.

Figure 2:
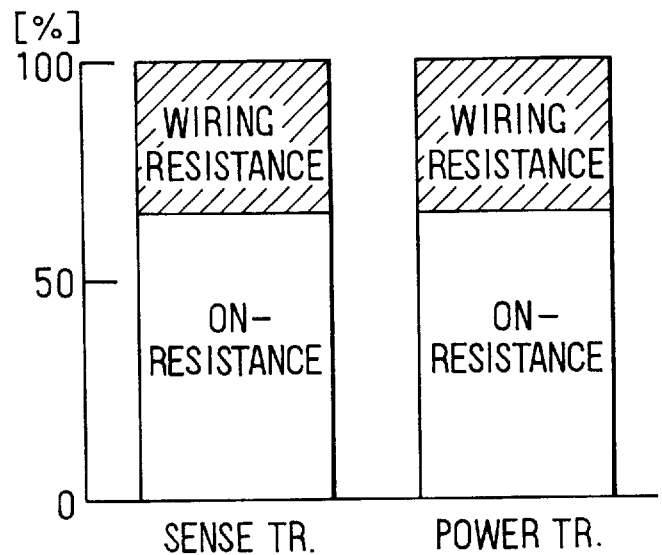
FIG. 2 is a graph showing resistance ratios in the sense transistor circuit and the power transistor circuit of the circuit in FIG. 1.
Figure 3:
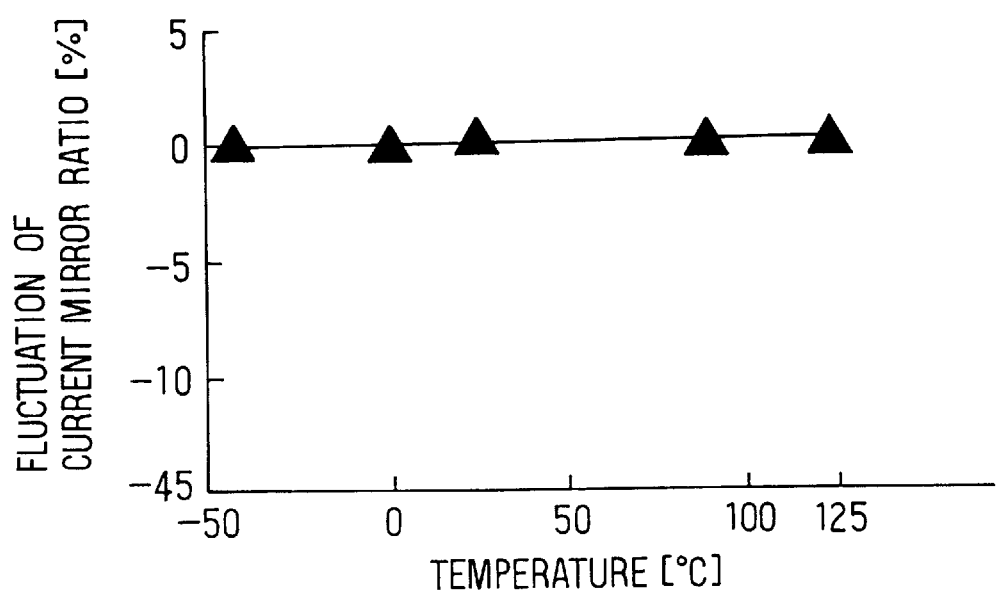
FIG. 3 is a graph showing fluctuations of a current mirror ratio of the embodiment shown in FIG. 1 according to temperature.
Figure 4:
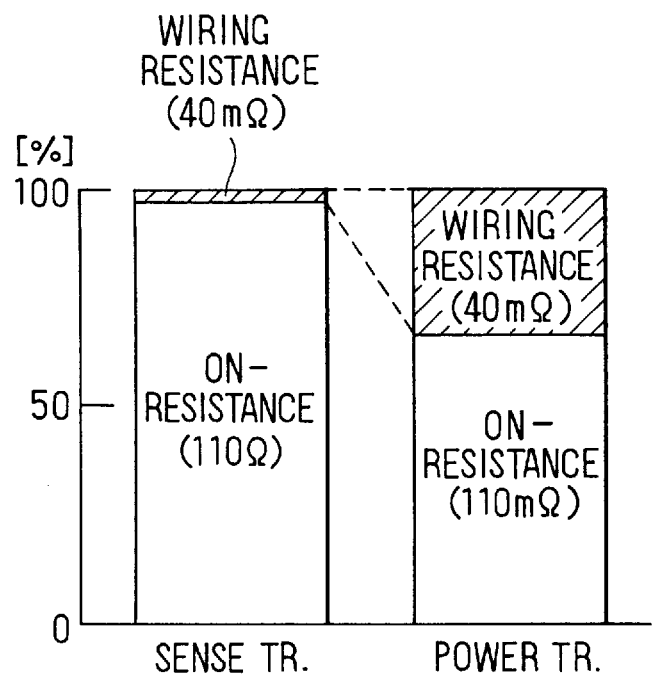
FIG. 4 is a graph showing resistance ratios in a sense transistor circuit and a power transistor circuit of a prior art.
Figure 5:
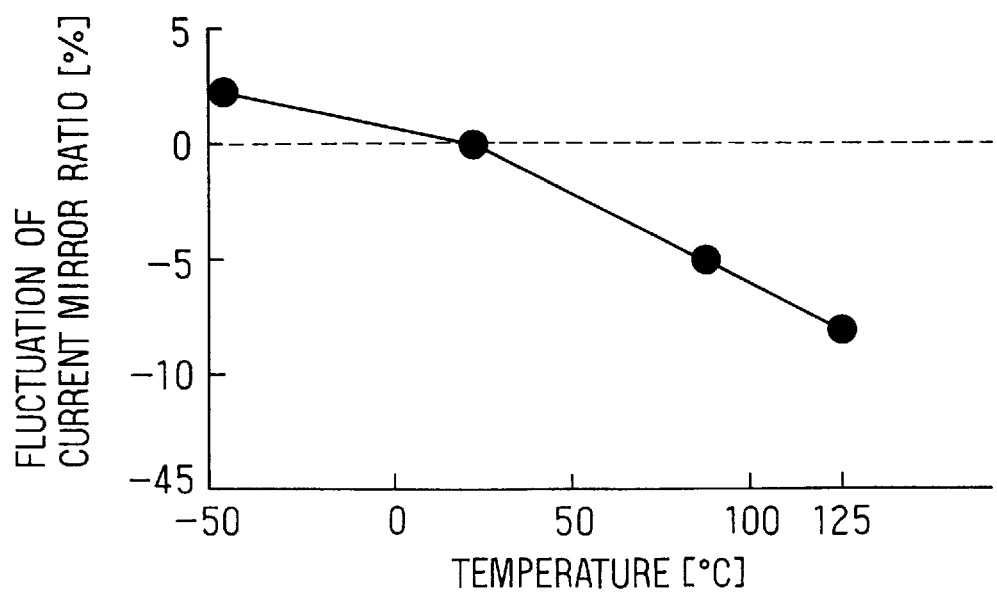
FIG. 5 is a graph showing fluctuations of a current mirror ratio of a prior art.

A first compensating resistor 5a and a second compensating resistor 5b are connected to the drain and the source of the sense transistor 4, respectively. Because the point "B" acts as a virtual ground, the sense transistor 4 including the compensating resistors is virtually connected between the points "A" and "B" in parallel with the power transistor 3. The wiring resistance of the sense transistor 4 between the points "A" and "B" is increased by adding the compensating resistors 5a and 5b. In this manner, a resistance ratio of wiring resistance to ON-resistance of the sense transistor 4 in the sense transistor circuit between the points "A" and "B" is made substantially equal to a resistance ratio of wiring resistance to ON-resistance of the power transistor 3 in the power transistor circuit between the point "A" and the ground. For example, when the resistance value of the compensating resistors 5a and 5b is 20 Ω each and the ON-resistance of the sense transistor 4 is 110 Ω, and the wiring resistance of the power transistor circuit is 40 mΩ and the ON-resistance of the power transistor 3 is 110 mΩ, the resistance ratios in both sensing and power transistor circuits become substantially equal, as shown in FIG. 2. By making both resistance ratios substantially equal, the fluctuation of the current mirror ratio becomes very low. As shown in FIG. 3, the current mirror ratio fluctuates only in a small range within plus or minus 1 percent throughout a wide range of temperature from −40° to +125° C.

In addition, if the wiring resistances including the compensating resistors 5a and 5b connected respectively to both drain and source sides of the sense transistor 4 are selected at an equal value, both transistors 3 and 4 can be operated at the same operating point, assuming that the wiring resistances of both drain and source sides of the power transistor 3 are also equal. This is results from the voltage between the gate and the source of the sense transistor 4 being made equal to that of the power transistor 3 under such conditions.

Both of the power transistor 3 and the sense transistor 4 are formed on a semiconductor substrate and connected to each other by aluminum wiring. The compensating resistors 5a and 5b are respectively formed in the wiring by forming aluminum in a comb shape. The compensating resistors may be diffused resistors formed on the semiconductor substrate. The resistance value of the compensating resistors, however, can be made more accurately by forming aluminum wiring than by a diffusion process on the substrate.

Although the resistance ratio of the wiring resistance to the ON-resistance of the sense transistor 4 is made substantially equal to that of the power transistor 3 by adding the first and second compensating resistors 5a and 5b in the embodiment described above, this may be achieved by some other ways. For example, instead of adding the compensating resistors in the sense transistor circuit, the wiring resistance in the power transistor circuit may be made very small by making the thickness of aluminum wiring much thicker.

It may be also possible to construct the current detection circuit 6 so that it detects an over-current by comparing a voltage across a shunt resistor disposed in the sense transistor circuit with a threshold voltage. In this case, the value of compensating resistors 5a and 5b is determined so that the resistance ratio of the wiring resistance, including a resistance of the shunt resistor, to the ON-resistance of the sense transistor 4 in the sense transistor circuit becomes substantially equal to that in the power transistor circuit.

The power transistor 3 and the sense transistor 4 are not limited to N-channel transistors, but they may be P-channel transistors. Also, they are not limited to MOS transistors but they may be semiconductor power elements such as IGBTs. Further, it is possible to include in the current detection circuit 6 a function to compensate temperature dependent characteristics of the current mirror ratio.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A load current supply circuit having a current sensing function comprising:

a power transistor circuit, including a power transistor and wiring connected to both sides of the power transistor, for conducting load current therethrough;

a sense transistor circuit, including a sense transistor and wiring connected to both sides of the sense transistor, connected in parallel with the power transistor circuit thereby constituting a current mirror circuit together with the power transistor circuit, for conducting sense current which is proportional to and less than the load current through the sense transistor circuit; and a current detection circuit connected to the sense transistor circuit for detecting the load current based on the sense current; wherein a resistance ratio of wiring resistance to ON-resistance of the sense transistor in the sense transistor circuit is substantially equal to a resistance ratio of wiring resistance to ON-resistance of the power transistor in the power transistor circuit.

2. A load current supply circuit having a current sensing function according to claim 1, wherein compensating resistors are connected to both sides of the sense transistor in the wiring of the sense transistor circuit.

3. A load current supply circuit having a current sensing function according to claim 1, wherein the wiring of both power transistor and sense transistor circuits is made of metal and compensating resistors made of metal are connected to both sides of the sense transistor in the sense transistor circuit.

4. A load current supply circuit having a current sensing function according to claim 2, wherein values of the compensating resistors are selected so that both of the power and sense transistors operate at a substantially same operating point.

5. A load current supply circuit having a current sensing function according to claim 4, wherein the compensating resistors connected to both sides of the sense transistor have substantially the same value.

6. A load current supply circuit having a current sensing function comprising:

a power transistor circuit, including a power transistor, for conducting load current therethrough;

a sense transistor circuit, including a sense transistor, connected in parallel with the power transistor circuit thereby constituting a current mirror circuit together with the power transistor circuit, for conducting sense current which is proportional to and less than the load current through the sense transistor circuit; and an operating point control circuit connected to the sense transistor circuit for maintaining an operating point of the sense transistor circuit at the substantially same point as that of the power transistor circuit; wherein a resistance ratio of wiring resistance to ON-resistance of the sense transistor in the sense transistor circuit is substantially equal to a resistance ratio of wiring resistance to ON-resistance of the power transistor in the power transistor circuit so as to maintain a current mirror ratio in the current mirror circuit at a substantially constant level.

7. A load current supply circuit having a current sensing function according to claim 6, wherein:

the power transistor circuit includes a first terminal and a second terminal;

the sense transistor circuit includes a first terminal connected to the first terminal of the power transistor circuit and a second terminal; and the operating point control circuit comprises means for controlling an electrical potential at the second terminal of the sense transistor circuit so that the electrical potential at the second terminal of the sense transistor circuit is substantially equal to an electrical potential at the second terminal of the power transistor circuit.

8. A load current supply circuit having a current sensing function according to claim 2, wherein:

the current detection circuit includes a compensator connected to an end of one of the compensating resistors so that said end of one of the compensating resistors becomes a virtual ground.

9. A load current supply circuit having a current sensing function according to claim 7, further comprising:

a first compensating resistor connected between the first terminal of the sense transistor circuit and the sense transistor; and a second compensating resistor connected between the second terminal of the sense transistor circuit and the sense transistor;

wherein the operating point control circuit further includes a compensator connected to the second terminal of the sense transistor circuit.

10. A load current supply circuit having a current sensing function according to claim 8, wherein said compensator includes a comparator having an input connected to said end of one of the compensating resistors.

11. A load current supply circuit having a current sensing function according to claim 10, wherein an output of said comparator is provided to a control circuit, said control circuit controlling gate voltages of said power transistor and said sense transistor.

12. A load current supply circuit having a current sensing function according to claim 9, wherein said compensator includes a comparator having an input connected to the second terminal of the sense transistor circuit.

* * * * *